(12) United States Patent
Ohtsuka et al.

(10) Patent No.: US 7,158,424 B2
(45) Date of Patent: Jan. 2, 2007

(54) SEMICONDUCTOR MEMORY DEVICE (75) Inventors: Hidefumi Ohtsuka, Osaka (JP); Kiyoto Ohta, Osaka (JP); Tomonori Fujimoto, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/006,588

(22) Filed: Dec. 8, 2004

(65) Prior Publication Data
US 2005/0128786 A1 Jun. 16, 2005

(30) Foreign Application Priority Data
Dec. 10, 2003 (JP) .............................. 2003-411308

(51) Int. Cl.
*G11C 7/00* (2006.01)

(52) U.S. Cl. ............................ 365/189.11; 365/189.09; 365/226

(58) Field of Classification Search ..................... None
See application file for complete search history.

(56) References Cited

U.S. PATENT DOCUMENTS

| 5,475,646 | A | * | 12/1995 | Ogihara | ..................... 365/222 |
| 5,872,737 | A | * | 2/1999 | Tsuruda et al. | ........ 365/189.05 |
| 5,896,320 | A | * | 4/1999 | Taguchi | ...................... 365/226 |
| 6,147,916 | A | * | 11/2000 | Ogura | ......................... 365/203 |
| 6,335,893 | B1 | | 1/2002 | Tanaka et al. | |
| 6,373,763 | B1 | * | 4/2002 | Taito et al. | ................. 365/203 |
| 6,449,208 | B1 | * | 9/2002 | Kono et al. | ................. 365/226 |

FOREIGN PATENT DOCUMENTS

JP          6-140889          5/1994

* cited by examiner

*Primary Examiner*—Tan T. Nguyen
(74) *Attorney, Agent, or Firm*—McDermott Will & Emery LLP (57) ABSTRACT

In order to decrease the circuit scale of a power supply circuit and the area occupied by the power supply circuit over a semiconductor substrate, the power supply circuit, which supplies a supply voltage to respective parts of a memory circuit, includes a word driver power supply (first power supply circuit), a sense amplifier power supply (second power supply circuit), a bit line precharge power supply, a cell plate power supply, a substrate bias power supply, and a word line bias power supply. The word driver power supply supplies a word driver with a voltage generated by directly increasing an external supply voltage, whereas the other power supplies (e.g., the sense amplifier power supply) supply a sense amplifier, etc., with a voltage generated by decreasing the external supply voltage.

10 Claims, 12 Drawing Sheets

SEMICONDUCTOR MEMORY DEVICE

CROSS-REFERENCE TO RELATED APPLICATION

This application claims priority under 35 U.S.C. §119(a) on Japanese Patent Application No. 2003-411308 filed on Dec. 10, 2003, the entire contents of which are hereby incorporated by reference.

BACKGROUND OF THE INVENTION

The present invention relates to a semiconductor memory device called DRAM (dynamic random access memory), or the like, and specifically to a structure of a semiconductor memory device which is associated with a power supply circuit.

In a semiconductor memory device, such as a DRAM, or the like, a predetermined voltage is applied to a word line, and a potential difference generated on a bit line by application of the predetermined voltage is amplified by a sense amplifier, whereby stored information is read out. The supply voltage supplied to a word driver which drives the word line is set to a level higher than a supply voltage supplied to the sense amplifier, or the like, such that the potential difference on the bit line becomes as large as possible.

In recent years, meanwhile, the margins for a variation in the supply voltage supplied from a device external to the semiconductor memory device have been decreasing as the semiconductor process becomes finer or as the operation voltage becomes lower. In order to overcome such a problem, a regulated power supply circuit is provided inside the semiconductor memory device such that an internal supply voltage generated by decreasing and stabilizing an external supply voltage is supplied to a sense amplifier, or the like. The once decreased and stabilized internal supply voltage is increased by a pump-up circuit and supplied to the word driver (see, for example, Japanese Unexamined Patent Publication No. 6-140889).

However, in the above conventional semiconductor memory device, the degree of voltage conversion by the pump-up circuit is large because the once decreased internal supply voltage is increased before being supplied to the word driver. Therefore, the conversion efficiency of the voltage is low, and the circuit scale of the power supply circuit including the pump-up circuit and the area occupied by the power supply circuit are relatively large. These problems become more noticeable as the semiconductor process becomes finer for the purpose of increasing the storing density of the principal part of a memory circuit.

SUMMARY OF THE INVENTION

In view of the above, an objective of the present invention is to decrease the circuit scale of a power supply circuit and the area occupied by the power supply circuit over a semiconductor substrate while supplying an appropriate supply voltage to each part of a semiconductor memory device.

In order to achieve the above objective, the first semiconductor memory device of the present invention is a semiconductor memory device comprising: a plurality of memory cells for storing information by storing an electric charge; an access transistor having one source/drain terminal connected to the memory cell and the other source/drain terminal connected to a bit line; a word line connected to a gate terminal of the access transistor; a sense amplifier for amplifying a voltage of the bit line; a first power supply circuit for generating a first supply voltage which is used for driving the word line; and a second power supply circuit for generating a second supply voltage which is used for driving the sense amplifier, wherein the first power supply circuit increases a supply voltage supplied from an external power supply, and the second power supply circuit decreases the supply voltage supplied from the external power supply.

With the above structure, the second power supply circuit outputs a voltage generated by decreasing a supply voltage supplied from the external power supply whereas the first power supply circuit outputs a voltage generated by directly increasing a supply voltage supplied from the external power supply. Accordingly, an increment in the voltage by the first power supply is small. As a result, high voltage conversion efficiency and stability are achieved, and the circuit scale is decreased to a small area. Herein, the bit line may include an inverted bit line.

The second semiconductor memory device according to an embodiment of the present invention is based on the first semiconductor memory device, which further comprises an operation control circuit for controlling the operation of the semiconductor memory device, wherein the second power supply circuit also supplies the second supply voltage to the operation control circuit.

The third semiconductor memory device according to an embodiment of the present invention is based on the first semiconductor memory device, wherein the first power supply circuit includes: a charge pump circuit; an oscillation circuit for supplying a clock signal to the charge pump circuit; and a voltage control circuit for controlling an output voltage of the charge pump circuit to be kept constant irrespective of a variation in the supply voltage supplied from the external power supply.

The fourth semiconductor memory device according to an embodiment of the present invention is based on the first semiconductor memory device, wherein: the sense amplifier includes a sense amplifier transistor; the access transistor and the sense amplifier transistor are formed by transistors having gate insulating films of different thicknesses; and the gate insulating film of the access transistor is thicker than that of the sense amplifier transistor.

With the above features, a stable increased or decreased voltage is supplied to respective parts of the semiconductor memory device.

The fifth semiconductor memory device according to an embodiment of the present invention is based on the first semiconductor memory device, wherein the first power supply circuit has a temperature characteristic such that the first supply voltage increases as the temperature decreases.

With the above feature, the temperature characteristic of the threshold voltage of the access transistor is compensated by the temperature characteristic of the voltage which drives the word line, whereby the access transistor is appropriately driven.

The sixth semiconductor memory device according to an embodiment of the present invention is based on the first semiconductor memory device, which further comprises a third power supply circuit which decreases the supply voltage supplied from the external power supply to apply the decreased voltage to the bit line as a precharge voltage and to a common counter electrode of the memory cell as a common counter electrode voltage.

The seventh semiconductor memory device according to an embodiment of the present invention is based on the sixth semiconductor memory device, wherein the third power supply circuit is formed by connecting outputs of a plurality of power supply circuits to each other.

The eighth semiconductor memory device according to an embodiment of the present invention is based on the first semiconductor memory device, which further comprises a third power supply circuit which decreases the supply voltage supplied from the external power supply to apply the decreased voltage to the word line as a bias voltage and to a substrate of the access transistor as a bias voltage.

The ninth semiconductor memory device according to an embodiment of the present invention is based on the eighth semiconductor memory device, wherein the third power supply circuit is formed by connecting outputs of a plurality of power supply circuits to each other.

With the above features, the area occupied by the power supply circuit over the semiconductor substrate is decreased to a small area by sharing the power supply circuit. Further, the potentials at both ends of the memory cell change in conjunction with each other, and a stored electric charge is efficiently used. As a result, a margin for a low-voltage operation is readily secured.

The tenth semiconductor memory device according to an embodiment of the present invention is based on the first semiconductor memory device, wherein: a memory circuit including the memory cell and a logic circuit having a function associated with the memory circuit are provided in different regions on the same semiconductor substrate; and the first power supply circuit and the second power supply circuit are provided in the region in which the logic circuit is provided.

The eleventh semiconductor memory device according to an embodiment of the present invention is based on the first semiconductor memory device, wherein: a plurality of memory circuits each including the memory cells are provided on the same semiconductor substrate; and the first power supply circuit and the second power supply circuit respectively supply the first supply voltage and the second supply voltage commonly to the plurality of memory circuits.

With the above features, the power supply circuit is shared among a plurality of memory circuits. Thus, the circuit scale of the power supply circuit is further decreased.

The twelfth semiconductor memory device according to an embodiment of the present invention is based on the first semiconductor memory device, wherein the first power supply circuit and the second power supply circuit respectively control the first supply voltage and the second supply voltage to be kept constant irrespective of a variation in the supply voltage supplied from the external power supply.

The thirteenth semiconductor memory device according to an embodiment of the present invention is based on the twelfth semiconductor memory device, wherein the first power supply circuit and the second power supply circuit respectively control the first supply voltage and the second supply voltage based on a common reference voltage.

With the above features, the area required for the power supply circuit over the semiconductor substrate is further decreased. Further, the effect of production variations which are likely to increase as the semiconductor process becomes finer is readily reduced.

DESCRIPTION OF THE PREFERRED EMBODIMENTS

Hereinafter, embodiments of the present invention will be described in detail with reference to the drawings.

(Embodiment 1)

Figure 1:
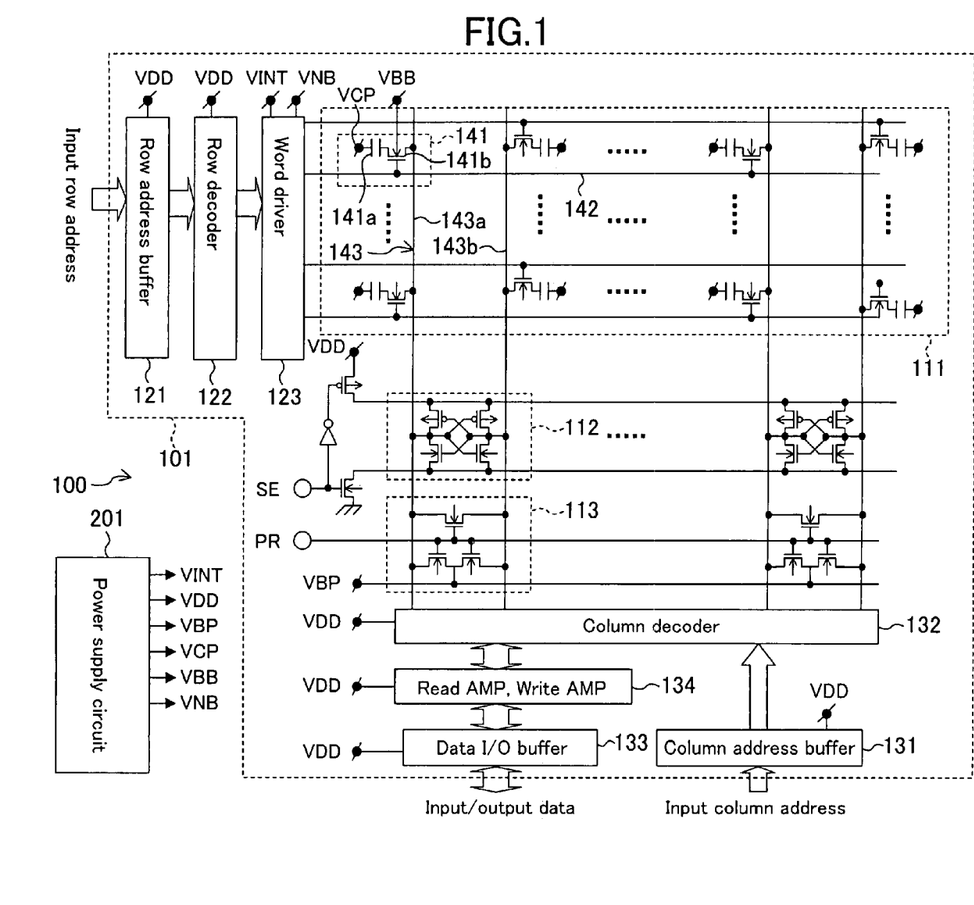
FIG. 1 is a circuit diagram showing a structure of a DRAM 100 according to embodiment 1.

A DRAM 100, a semiconductor memory device of the present invention, includes a memory circuit 101 and a power supply circuit 201 as shown in FIG. 1.

The memory circuit 101 includes a memory cell array 111, a sense amplifier 112, a precharge-equalization circuit 113, a row address buffer 121, a row decoder 122, a word driver 123, a column address buffer 131, a column decoder 132, a data I/O buffer 133 and a read/write amplifier 134. The memory cell array 111 includes a memory cell 141 which is formed by a capacitor 141a and an access transistor 141b, a word line 142, and a bit line pair 143 formed by pairing a bit line 143a and an inverted bit line 143b. A transistor which forms each of the above circuits is, for example, a MIS (Metal Insulator Semiconductor) transistor. The gate insulating film of the access transistor 141b is thicker than, for example, the gate insulating film of a transistor which constitutes the sense amplifier 112 or, in the case of providing a logic circuit to which an external supply voltage is directly supplied, the gate insulating film of a transistor of the logic circuit. Thus, high reliability is achieved even when an increased voltage is applied to the word line 142 as will be described later.

Figure 2:
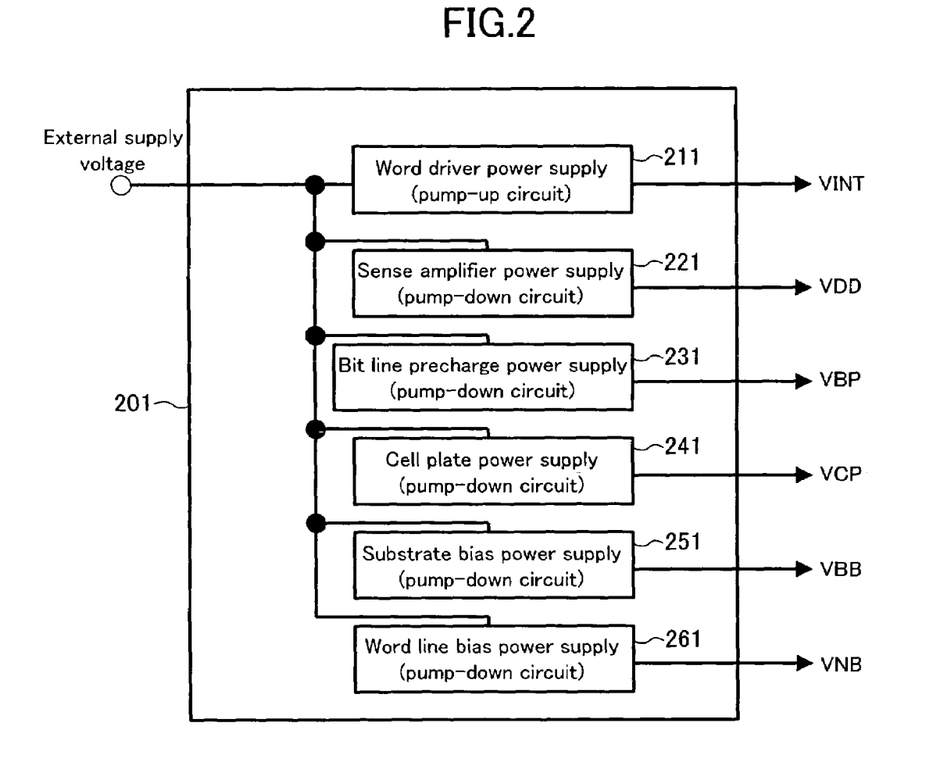
FIG. 2 is a block diagram showing a structure of a power supply circuit 201 of embodiment 1.

Referring to FIG. 2, the power supply circuit 201, which supplies a supply voltage to respective parts of the memory circuit 101, includes a word driver power supply (first power supply circuit) 211, a sense amplifier power supply (second power supply circuit) 221, a bit line precharge power supply 231, a cell plate power supply 241, a substrate bias power supply 251 and a word line bias power supply 261.

The word driver power supply 211 supplies the word driver 123 with voltage VINT which is generated by increasing the external supply voltage.

The sense amplifier power supply 221 also supplies voltage VDD to an operation control circuit for controlling the operation of the DRAM 100, e.g., the row decoder 122, or the like, as well as to the sense amplifier 112.

The bit line precharge power supply 231 supplies the precharge-equalization circuit 113 with voltage VBP for precharging the bit lines 143a and 143b.

The cell plate power supply 241 supplies voltage VCP to a common counter electrode of each capacitor 141a.

The substrate bias power supply 251 supplies voltage VBB to a substrate of the access transistor 141b.

The word line bias power supply 261 supplies the word driver 123 with negative bias voltage VNB which is applied to a word line 142 that is unselected based on a row address to reduce the leakage current.

It should be noted that the present invention is not limited to an example where the memory circuit 101 is supplied with a supply voltage from any of the above power supplies. For example, an external supply voltage may further be supplied directly to the memory circuit 101.

The word driver power supply 211 is formed by a pump-up circuit, whereas the other power supplies (e.g., the sense amplifier power supply 221) are each formed by a pump-down circuit. (Precisely speaking, the substrate bias power supply 251 and the word line bias power supply 261 each output a negative bias voltage generated by polarity inversion.) Specifically, referring to FIG. 3, the word driver power supply 211 includes a pump-up control circuit 212, an oscillator 213 and a charge pump circuit 214.

Figure 3:
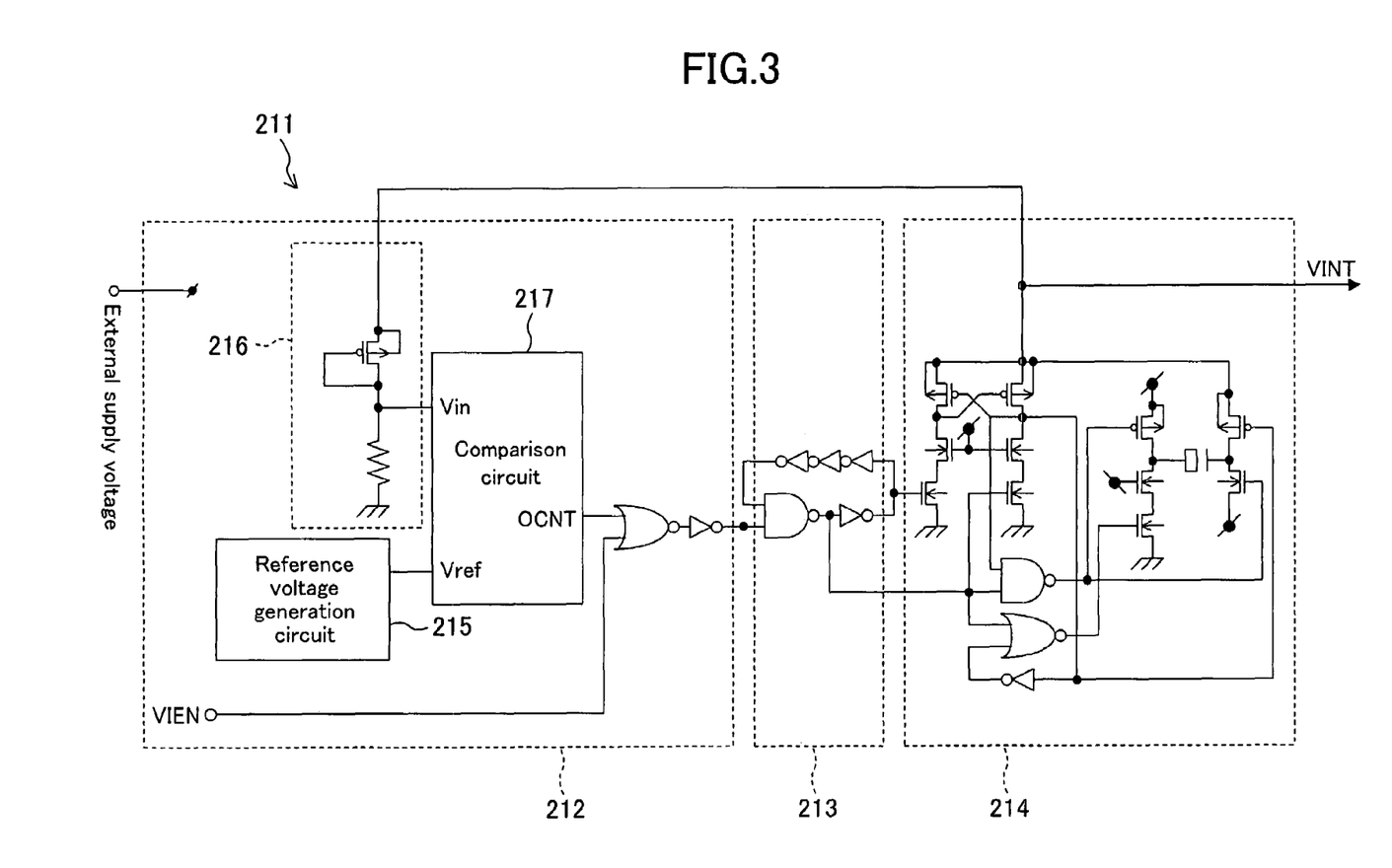
FIG. 3 is a circuit diagram showing details of a structure of a word driver power supply 211 of embodiment 1.
Figure 4:
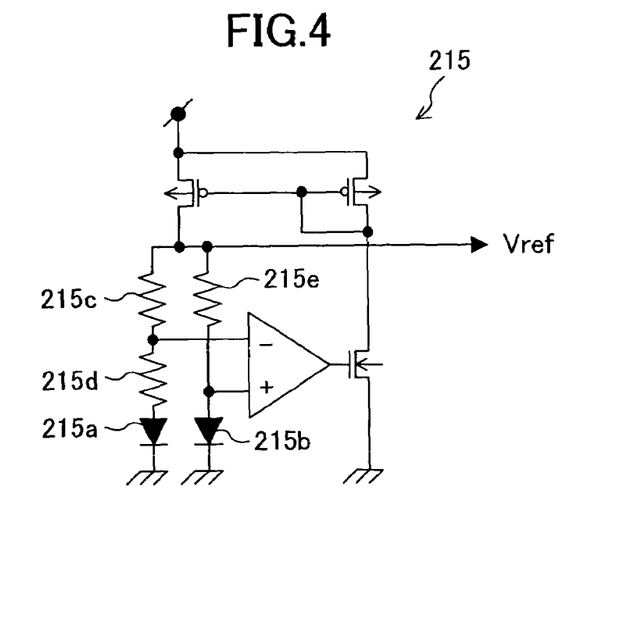
FIG. 4 is a circuit diagram showing a structure of a reference voltage generation circuit 215 of the word driver power supply 211 of embodiment 1.

The pump-up control circuit 212 includes a reference voltage generation circuit 215 for generating reference voltage Vref (e.g., about 1 V), a comparison voltage generation circuit 216 for outputting comparison voltage Vin based on voltage VINT output from the charge pump circuit 214, and a comparison circuit 217 for comparing reference voltage Vref and comparison voltage Vin. The reference voltage generation circuit 215 is, for example, a band gap reference circuit which includes diodes 215a and 215b and resistors 215c to 215e as shown in FIG. 4. Herein, the areas of the diodes 215a and 215b and the resistance values of the resistors 215c to 215e are set such that the reference voltage generation circuit 215 has a negative temperature characteristic, whereby the positive temperature characteristic of the threshold voltage in the access transistor 141b is compensated. Specifically, for example, when the temperature decreases, the threshold voltage of the access transistor 141b increases, and voltage VINT increases. When comparison voltage Vin is higher than reference voltage Vref, the comparison circuit 217 lowers control signal OCNT to the L (Low) level. When comparison voltage Vin is lower than reference voltage Vref, the comparison circuit 217 raises control signal OCNT to the H (High) level. Signal VIEN in FIG. 3 is a pump-up enable signal for controlling whether or not to allow the word driver power supply 211 to perform a pump-up operation.

When the control signal output from the pump-up control circuit 212 is at the H level (Vin<Vref), the oscillator 213 outputs a clock signal. When the control signal output from the pump-up control circuit 212 is at the L level (Vin>Vref), the oscillator 213 stops outputting the clock signal.

When the clock signal is output from the oscillator 213, the charge pump circuit 214 gradually increases voltage VINT which is to be output therefrom.

Each part of the word driver power supply 211 is directly supplied with an external supply voltage as the supply voltage. Therefore, a voltage higher than the external supply voltage is output as voltage VINT.

Figure 5:
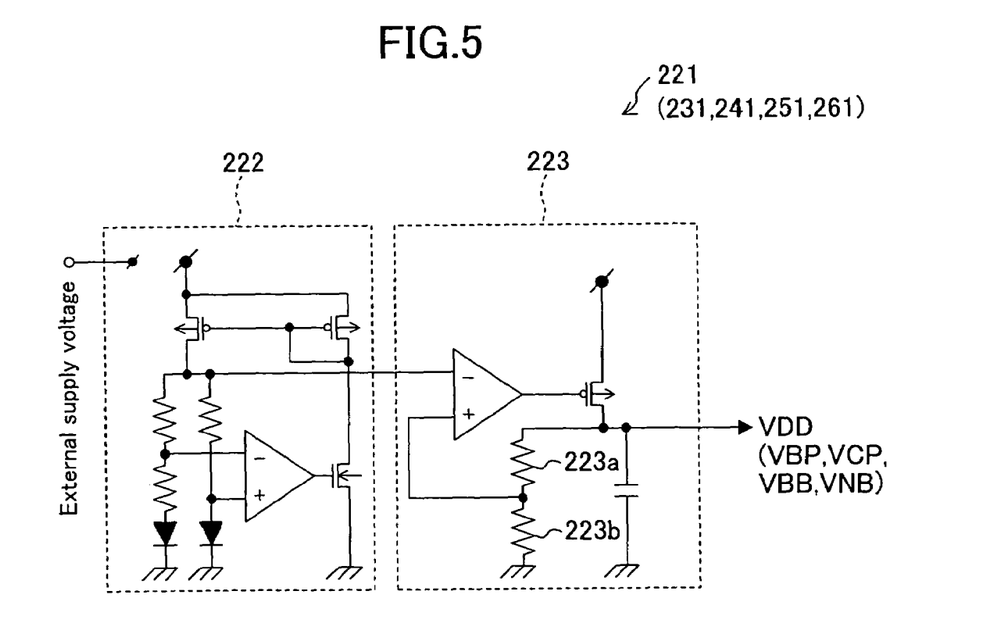
FIG. 5 is a circuit diagram showing a structure of a sense amplifier power supply 221 and related components of embodiment 1.
Figure 6:
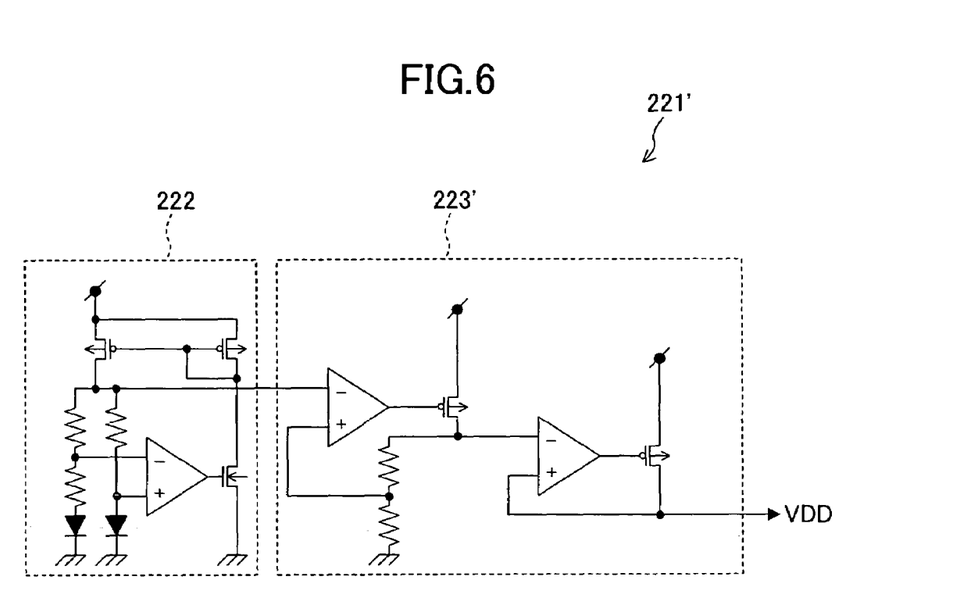
FIG. 6 is a circuit diagram showing a structure of an alternative sense amplifier power supply 221' and related components of embodiment 1.

The other power supplies (e.g., the sense amplifier power supply 221) each include, for example, a reference voltage generation circuit 222 and a regulated voltage output circuit 223 as shown in FIG. 5. The reference voltage generation circuit 222 has the same structure as that of the reference voltage generation circuit 215. The regulated voltage output circuit 223 outputs a voltage whose level is regulated based on a reference voltage output from the reference voltage generation circuit 222, i.e., voltage VDD, or the like, which is obtained by dividing the reference voltage at a division ratio determined according to the resistance values of resistors 223a and 223b. Also in the sense amplifier power supply 221, an external supply voltage is directly supplied as the supply voltage to each part as in the word driver power supply 211. Therefore, a voltage generated by decreasing the external supply voltage is output as voltage VDD, or the like. It should be noted that a sense amplifier power supply 221' including a regulated voltage output circuit 223' which has two stages of feedback loops as shown in FIG. 6 may be used in place of the above-described sense amplifier power supply 221. In this case, the output voltage is stabilized by faster feedback control, and power consumption is decreased to a relatively small amount.

As described above, the sense amplifier power supply 221, or the like, generates a voltage by decreasing an external supply voltage, whereas the word driver power supply 211 a voltage by directly increasing the external supply voltage, so that an increment in the voltage by the word driver power supply 211 is small. As a result, the voltage conversion efficiency is improved, and a highly-stabilized supply voltage is readily obtained. In addition, the circuit scale and the occupied area over a semiconductor substrate are readily decreased.

(Embodiment 2)

Other components of the power supply circuit are described. It should be noted that elements which have the same functions as those of embodiment 1 are denoted by the same reference numerals, and descriptions thereof are omitted.

Figure 7:
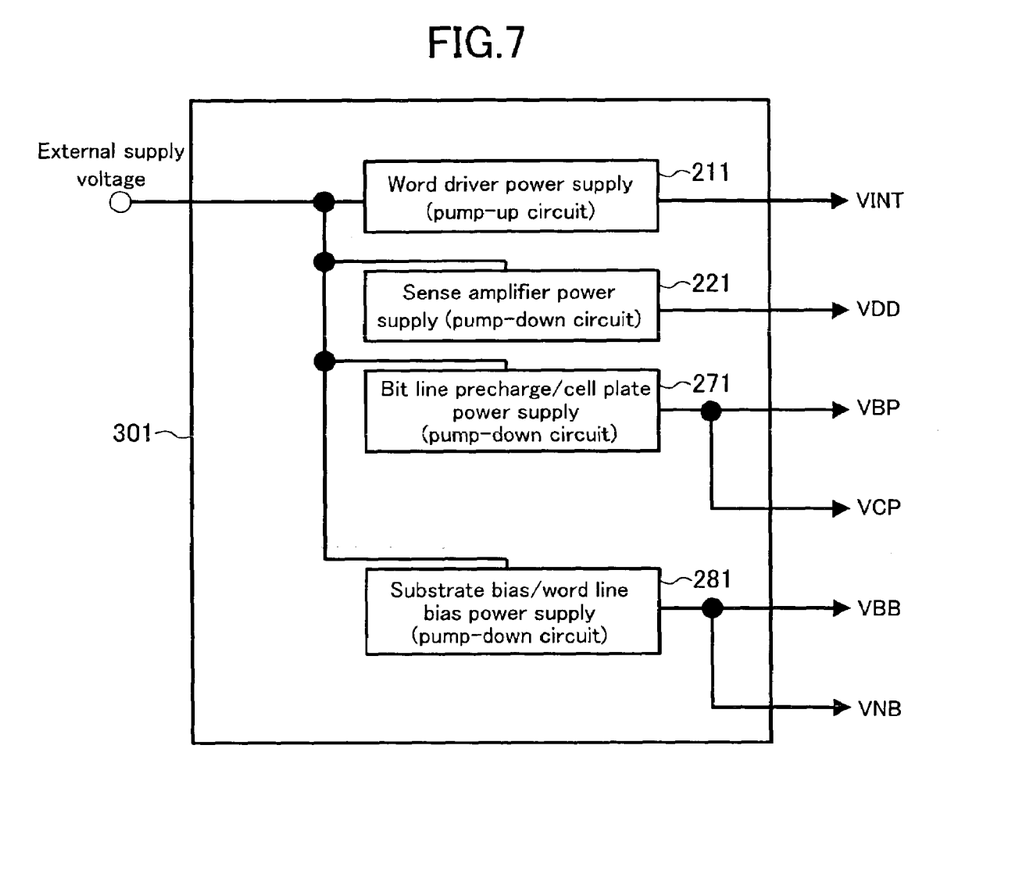
FIG. 7 is a block diagram showing a structure of a power supply circuit 301 of embodiment 2.

A power supply circuit 301 shown in FIG. 7 includes the word driver power supply 211 and the sense amplifier power supply 221 as in embodiment 1. The power supply circuit 301 further includes a bit line precharge/cell plate power supply (third power supply circuit) 271 in place of the bit line precharge power supply 231 and the cell plate power supply 241, and a substrate bias/word line bias power supply (third power supply circuit) 281 in place of the substrate bias power supply 251 and the word line bias power supply 261.

As described above, a single power supply circuit is commonly used for different purposes, whereby the total area occupied by the power supply circuits over a semiconductor substrate is decreased to a small area. Furthermore, the bit line precharge/cell plate power supply 271 is used for both bit line precharge and cell plate. In this structure, even when the output voltage of the power supply 271 is varied, the potentials at the opposite ends of the capacitor 141a change according to the variation. Thus, the charge stored in the capacitor 141a is efficiently used, so that a margin is readily secured for a voltage variation which is caused in a low-voltage operation.

Figure 8:
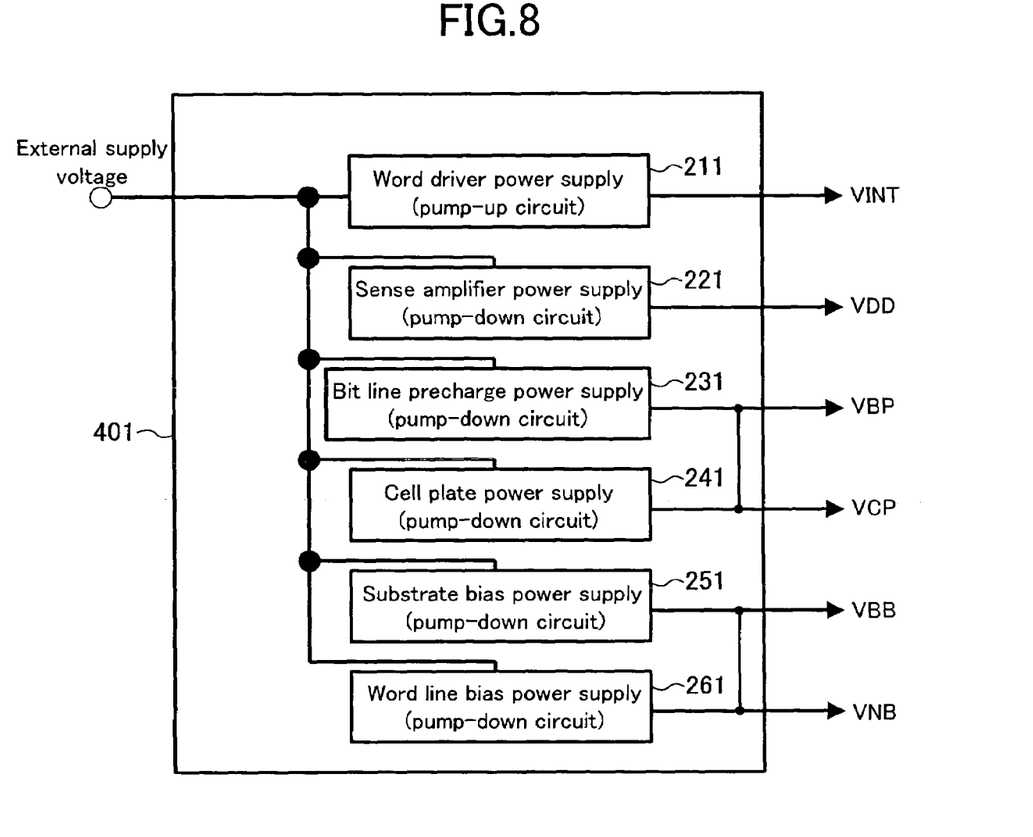
FIG. 8 is a block diagram showing a structure of a power supply circuit 401 of embodiment 2.

Alternatively, as in a power supply circuit 401 shown in FIG. 8, it is possible that the power supply circuits of embodiment 1 are provided, and the outputs of the bit line precharge power supply 231 and the cell plate power supply 241 are connected to each other. The outputs of the substrate bias power supply 251 and the word line bias power supply 261 may be connected to each other.

In the structure where the outputs of the bit line precharge power supply 231 and the cell plate power supply 241 are connected to each other as described above, a margin is readily secured for a low-voltage operation as in the example of FIG. 7. Further, in the case where the outputs of the power supply circuits are connected to each other, a back bias substrate, or the like, is readily shared. Thus, it is not necessary to provide a layout space for substrate separation (well formation). As a result, the required area over the semiconductor substrate is readily reduced.

The effect achieved by integrating the word driver power supply and the sense amplifier power supply, or the like, and the effect achieved by connecting the outputs of these power supplies to each other are obtained as well even in the case of using a power supply circuit which increases or further decreases a once-decreased voltage or a power supply circuit which includes no pump-up circuit.

(Embodiment 3)

Figure 9:
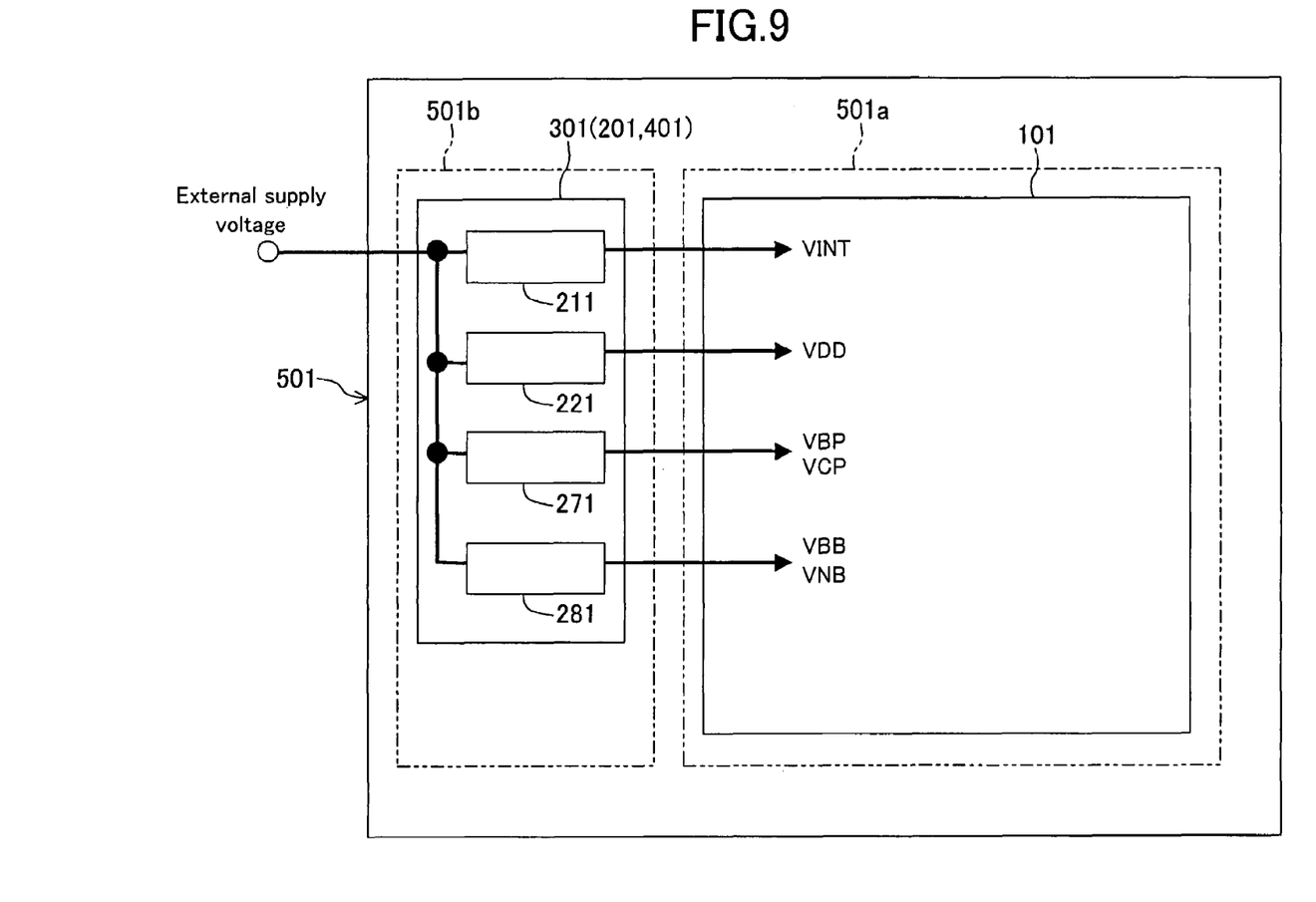
FIG. 9 illustrates an arrangement of respective circuits of a semiconductor memory device of embodiment 3.

A circuit of the above-described semiconductor memory device can be placed over a semiconductor substrate together with a logic circuit, such as a peripheral circuit, or the like, as shown in FIG. 9, for example. In FIG. 9, a memory region 501a and a logic circuit region 501b are provided over the semiconductor substrate 501. The memory region 501a includes the memory circuit 101 described in embodiment 1 (FIG. 1). The logic circuit region 501b includes an unshown logic circuit which has a function associated with the memory circuit 101, e.g., a memory management unit, or the like. The logic circuit region 501b further includes the power supply circuit 301 described in embodiment 2 (FIG. 7). (It should be noted that the component included in the logic circuit region 501b is not limited to the power supply circuit 301 but may be the power supply circuit 201 of FIG. 2 or the power supply circuit 401 of FIG. 8.) In an actual device, the memory region 501a and the logic circuit region 501b are clearly distinguishable at least by macro.

Alternatively, in a structure where the logic circuit region 501b includes the power supply circuit 301, or the like, it is possible that the memory region 501a includes a plurality of memory circuits 101, and the plurality of memory circuits 101 share the power supply circuit 301, or the like, of the logic circuit region 501b. With this structure, the required area over the semiconductor substrate 501 is further reduced. It should be noted that the effect achieved by sharing the power supply circuit as described above is obtained not only in the above arrangement but also in any other arrangement, e.g., an arrangement where the power supply circuit is provided in the memory region 501a. The above effect is achieved even in the case of using a power supply circuit which increases or further decreases a once-decreased voltage or a power supply circuit which includes no pump-up circuit so long as a plurality of memory circuits 101 are provided.

(Embodiment 4)

Figure 11:
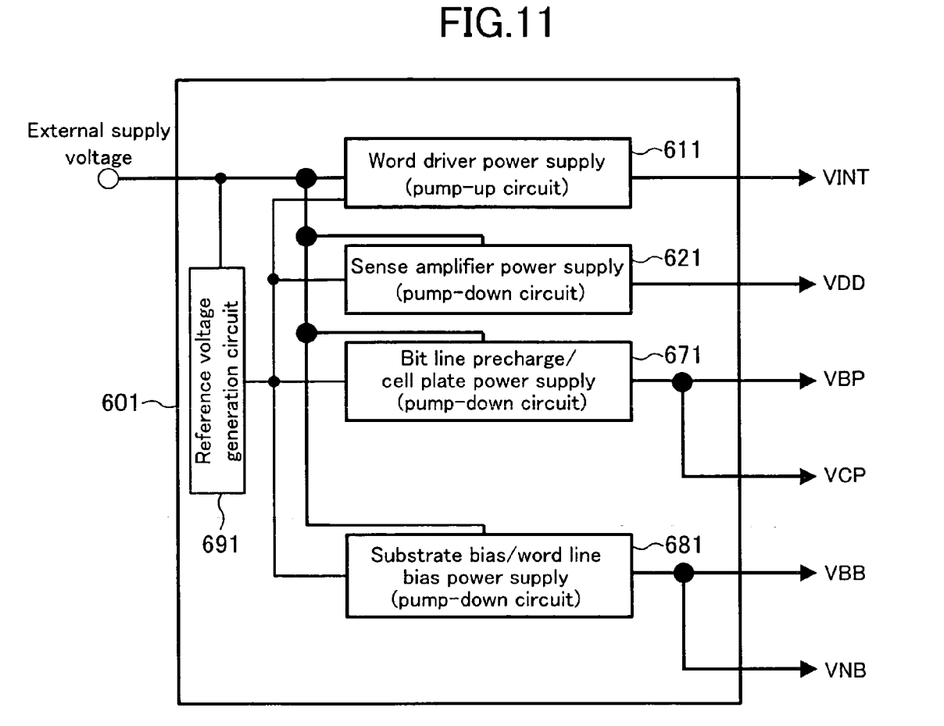
FIG. 11 is a block diagram showing a structure of a power supply circuit 601 of embodiment 4.

The power supply circuit for supplying a supply voltage to respective parts of a memory circuit may be a power supply circuit 601 shown in FIG. 11. The power supply circuit 601 includes a word driver power supply 611, a sense amplifier power supply 621, a bit line precharge/cell plate power supply 671, a substrate bias/word line bias power supply 681, and a reference voltage generation circuit 691 which is common among the power supplies 611, 621, 671, and 681. The power supplies 611, 621, 671 and 681 are respectively different from the power supplies 211, 221, 271 and 281 of embodiment 2 (FIG. 7) in that no reference voltage generation circuit is provided in the power supplies 611, 621, 671 and 681. Specifically, each of the power supplies 611, 621, 671 and 681 outputs a predetermined stabilized supply voltage based on a common reference voltage, for example, with the division ratio set for the resistors 223a and 223b of FIG. 5. With this structure where the reference voltage generation circuit 691 is shared among a plurality of power supplies, the required area over the semiconductor substrate is further reduced. Further, the effect of production variations which are likely to increase as the semiconductor process becomes finer is readily reduced. (It should be noted that the reference voltage generation circuit 691 may be provided in the same manner in the structure of the power supply circuit 201 of FIG. 2 or the power supply circuit 401 of FIG. 8.)

Figure 10:
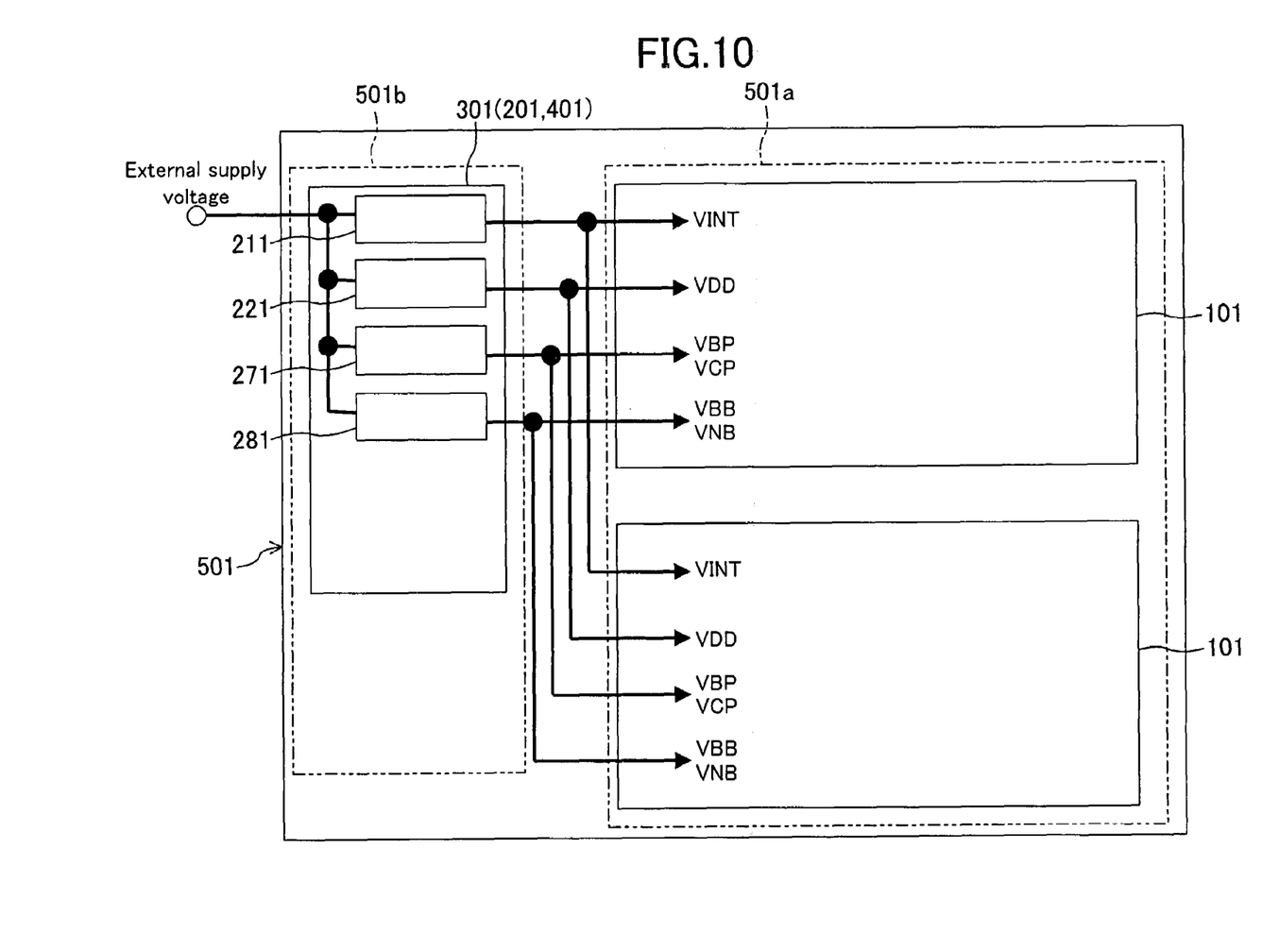
FIG. 10 illustrates an alternative arrangement of respective circuits of a semiconductor memory device of embodiment 3.
Figure 12:
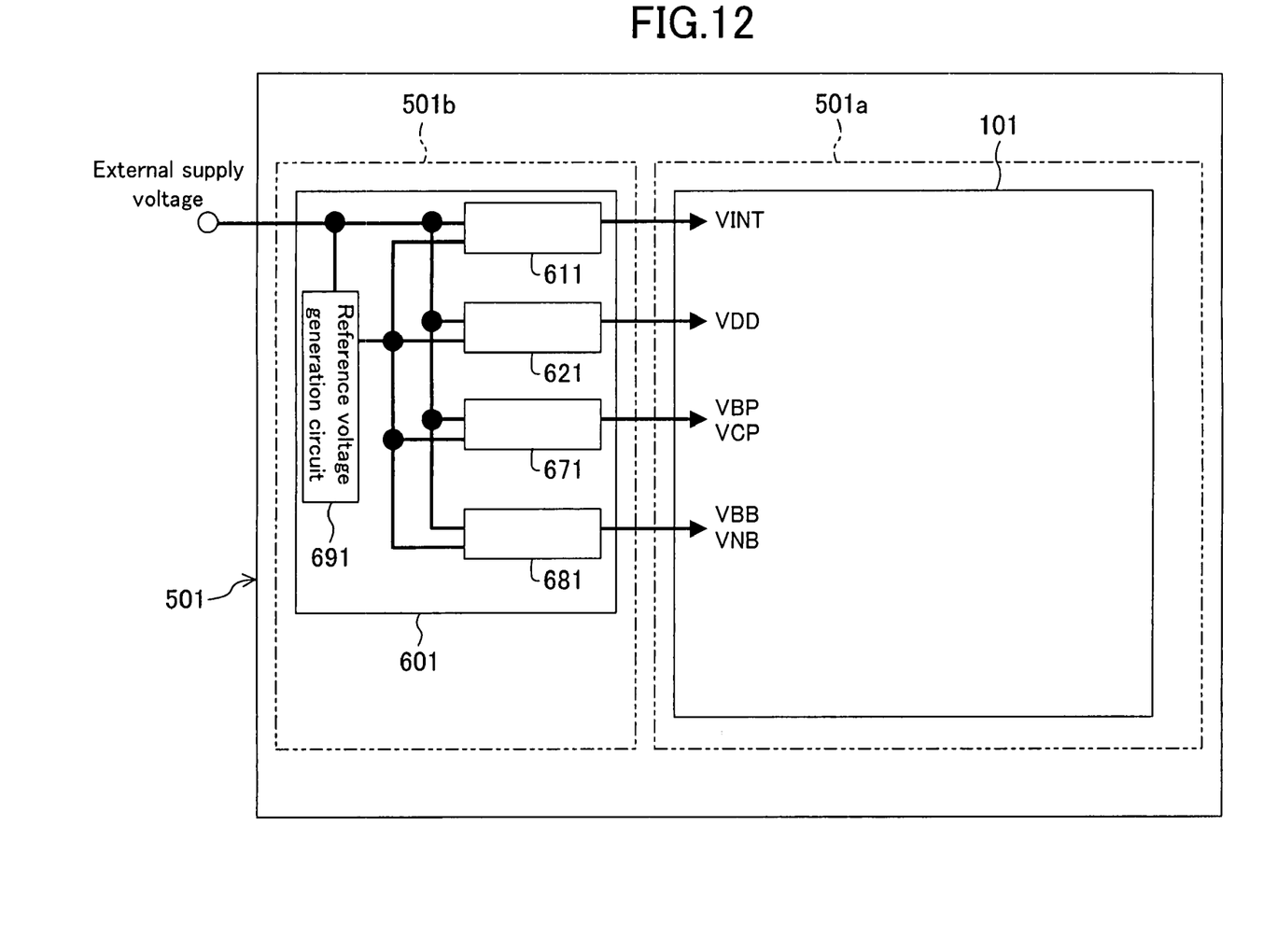
FIG. 12 illustrates an arrangement of respective circuits of a semiconductor memory device of embodiment 4.
Figure 13:
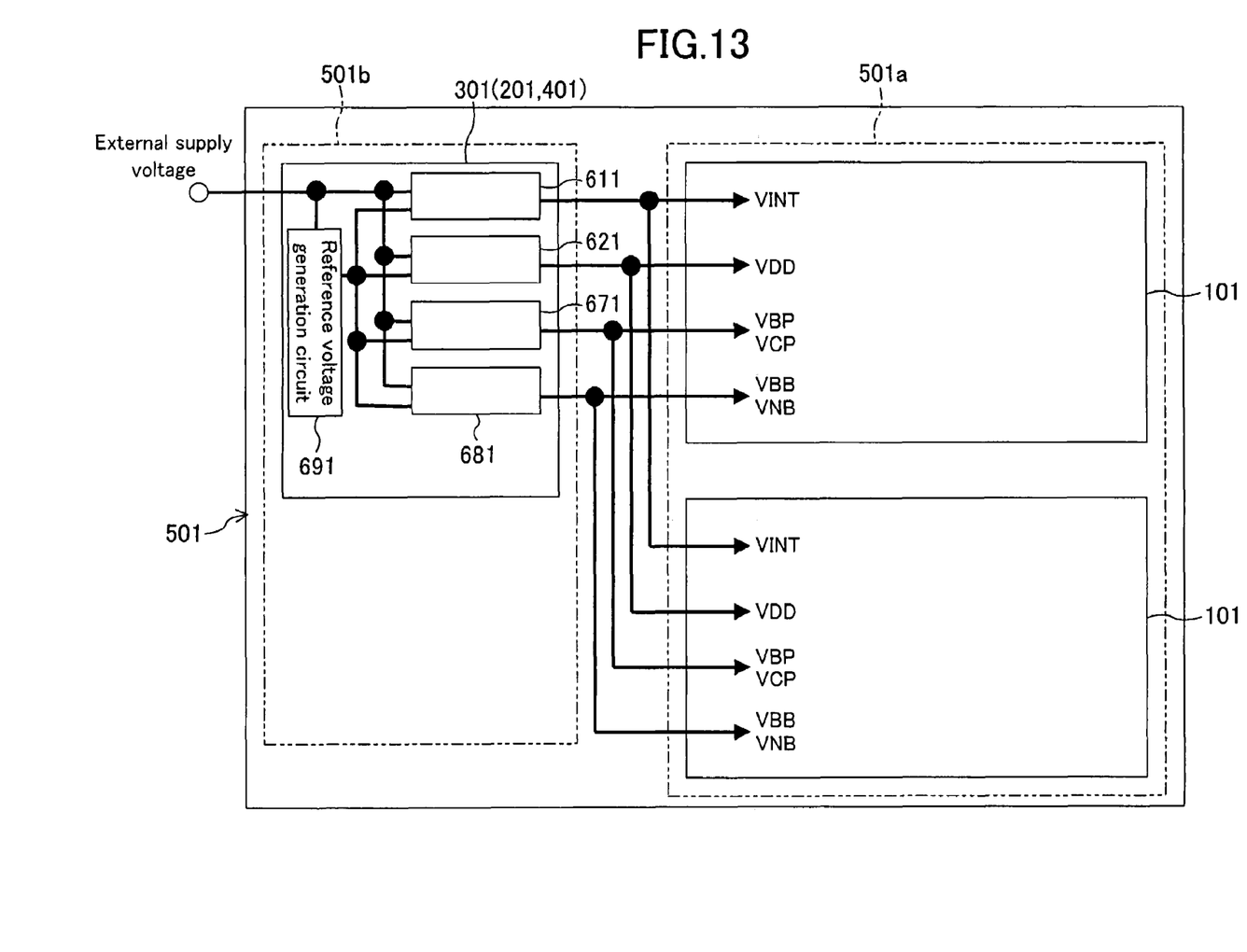
FIG. 13 illustrates an alternative arrangement of respective circuits of a semiconductor memory device of embodiment 4.

In the case where the power supply circuit 601 is formed on the semiconductor substrate 501, the power supply circuit 601 may be included in the logic circuit region 501b as shown in FIGS. 12 and 13 as described in embodiment 3 (FIGS. 9 and 10). As a matter of course, the effect achieved by sharing the reference voltage generation circuit among the plurality of power supply circuits is obtained not only in the above arrangement but also in any other arrangement, e.g., an arrangement where the power supply circuit is provided in the memory region 501a. The above effect is achieved even in the case of using a power supply circuit which increases or further decreases a once-decreased voltage or a power supply circuit which includes no pump-up circuit so long as the power supply circuit generates different levels of supply voltages.

As described above, a semiconductor memory device of the present invention possesses the effect of decreasing the circuit scale of a power supply circuit and the area occupied by the power supply circuit over a semiconductor substrate while supplying an appropriate supply voltage to each part of the semiconductor memory device. The semiconductor memory device of the present invention is useful as a semiconductor memory device called DRAM (dynamic random access memory), or the like.

What is claimed is:

1. A semiconductor memory device, comprising:
    a plurality of memory cells for storing information by storing an electric charge;
    an access transistor having one source/drain terminal connected to the memory cell and the other source/drain terminal connected to a bit line;
    a word line connected to a gate terminal of the access transistor;
    a sense amplifier for amplifying a voltage of the bit line;
    a first power supply circuit for generating a first supply voltage which is used for driving the word line; and
    a second power supply circuit for generating a second supply voltage which is used for driving the sense amplifier,
    wherein the first power supply circuit increases a supply voltage supplied from an external power supply,
    the second power supply circuit decreases the supply voltage supplied from the external power supply
    the sense amplifier includes a sense amplifier transistor;
    the access transistor and the sense amplifier transistor are formed by transistors having gate insulating films of different thicknesses; and
    the gate insulating film of the access transistor is thicker than that of the sense amplifier transistor.

2. A semiconductor memory device, comprising:
    a plurality of memory cells for storing information by storing an electric charge;

an access transistor having one source/drain terminal connected to the memory cell and the other source/drain terminal connected to a bit line;

a word line connected to a gate terminal of the access transistor;

a sense amplifier for amplifying a voltage of the bit line;

a first power supply circuit for generating a first supply voltage which is used for driving the word line; and a second power supply circuit for generating a second supply voltage which is used for driving the sense amplifier, wherein the first power supply circuit increases a supply voltage supplied from an external power supply, the second power supply circuit decreases the supply voltage supplied from the external power supply, and the first power supply circuit has a temperature characteristic such that the first supply voltage increases as the temperature decreases.

3. A semiconductor memory device, comprising:

a plurality of memory cells for storing information by storing an electric charge;

an access transistor having one source/drain terminal connected to the memory cell and the other source/drain terminal connected to a bit line;

a word line connected to a gate terminal of the access transistor;

a sense amplifier for amplifying a voltage of the bit line;

a first power supply circuit for generating a first supply voltage which is used for driving the word line;

a second power supply circuit for generating a second supply voltage which is used for driving the sense amplifier; and a third power supply circuit which decreases the supply voltage supplied from the external power supply to apply the decreased voltage to the bit line as a precharge voltage and to a common counter electrode of the memory cell as a common counter electrode voltage, wherein the first power supply circuit increases a supply voltage supplied from an external power supply, and the second power supply circuit decreases the supply voltage supplied from the external power supply.

4. The semiconductor memory device of claim 3, wherein the third power supply circuit is formed by connecting outputs of a plurality of power supply circuits to each other.

5. A semiconductor memory device, comprising:

a plurality of memory cells for storing information by storing an electric charge;

an access transistor having one source/drain terminal connected to the memory cell and the other source/drain terminal connected to a bit line;

a word line connected to a gate terminal of the access transistor;

a sense amplifier for amplifying a voltage of the bit line;

a first power supply circuit for generating a first supply voltage which is used for driving the word line;

a second power supply circuit for generating a second supply voltage which is used for driving the sense amplifier; and a third power supply circuit which decreases the supply voltage supplied from the external power supply to apply the decreased voltage to the word line as a bias voltage and to a substrate of the access transistor as a bias voltage, wherein the first power supply circuit increases a supply voltage supplied from an external power supply, and the second power supply circuit decreases the supply voltage supplied from the external power supply.

6. The semiconductor memory device of claim 5, wherein the third power supply circuit is formed by connecting outputs of a plurality of power supply circuits to each other.

7. A semiconductor memory device, comprising:

a plurality of memory cells for storing information by storing an electric charge;

an access transistor having one source/drain terminal connected to the memory cell and the other source/drain terminal connected to a bit line;

a word line connected to a gate terminal of the access transistor;

a sense amplifier for amplifying a voltage of the bit line;

a first power supply circuit for generating a first supply voltage which is used for driving the word line; and a second power supply circuit for generating a second supply voltage which is used for driving the sense amplifier, wherein the first power supply circuit increases a supply voltage supplied from an external power supply, the second power supply circuit decreases the supply voltage supplied from the external power supply, a memory circuit including the memory cell and a logic circuit having a function associated with the memory circuit are provided in different regions on the same semiconductor substrate, and the first power supply circuit and the second power supply circuit are provided in the region in which the logic circuit is provided.

8. A semiconductor memory device, comprising:

a plurality of memory cells for storing information by storing an electric charge;

an access transistor having one source/drain terminal connected to the memory cell and the other source/drain terminal connected to a bit line;

a word line connected to a gate terminal of the access transistor;

a sense amplifier for amplifying a voltage of the bit line;

a first power supply circuit for generating a first supply voltage which is used for driving the word line; and a second power supply circuit for generating a second supply voltage which is used for driving the sense amplifier, wherein the first power supply circuit increases a supply voltage supplied from an external power supply, the second power supply circuit decreases the supply voltage supplied from the external power supply, a plurality of memory circuits each including a plurality of memory cells are provided on the same semiconductor substrate, and the first power supply circuit and the second power supply circuit respectively supply the first supply voltage and the second supply voltage commonly to the plurality of memory circuits.

9. A semiconductor memory device, comprising:

a plurality of memory cells for storing information by storing an electric charge;

an access transistor having one source/drain terminal connected to the memory cell and the other source/drain terminal connected to a bit line;

a word line connected to a gate terminal of the access transistor;

a sense amplifier for amplifying a voltage of the bit line;
a first power supply circuit for generating a first supply voltage which is used for driving the word line; and
a second power supply circuit for generating a second supply voltage which is used for driving the sense amplifier,
wherein the first power supply circuit increases a supply voltage supplied from an external power supply,
the second power supply circuit decreases the supply voltage supplied from the external power supply, and
the first power supply circuit and the second power supply circuit respectively control the first supply voltage and the second supply voltage to be kept constant irrespective of a variation in the supply voltage supplied from the external power supply.

10. The semiconductor memory device of claim 9, wherein the first power supply circuit and the second power supply circuit respectively control the first supply voltage and the second supply voltage based on a common reference voltage.

* * * * *